United States Patent [19]

Hosotani et al.

[11] Patent Number: 4,945,535
[45] Date of Patent: Jul. 31, 1990

[54] INFORMATION PROCESSING UNIT

[75] Inventors: Osamu Hosotani; Koichi Kawauchi; Naoki takahashi, all of Hyogo, Japan

[73] Assignee: Mitsubishi Denki Kabushiki Kaisha, Tokyo, Japan

[21] Appl. No.: 234,433

[22] Filed: Aug. 19, 1988

[30] Foreign Application Priority Data

Aug. 25, 1987 [JP] Japan .................. 62-210607

[51] Int. Cl.$^5$ .......................................... G06F 11/10
[52] U.S. Cl. ................... 371/11.1; 365/200; 371/10.2
[58] Field of Search ............ 371/10, 10.1, 10.2, 371/11.1; 364/200 MS File, 900 MS File; 365/200

[56] References Cited

U.S. PATENT DOCUMENTS

| | | | |
|---|---|---|---|
| 3,898,443 | 8/1975 | Smith | 371/10 |
| 4,051,460 | 9/1977 | Yamada et al. | 364/900 |
| 4,475,194 | 10/1984 | LaVallee et al. | 371/10 |
| 4,654,847 | 3/1987 | Dutton | 371/10 |
| 4,737,935 | 4/1988 | Wawersig et al. | 365/200 |
| 4,751,703 | 6/1988 | Picon et al. | 371/10 |
| 4,796,233 | 1/1989 | Awaya et al. | 365/200 |

Primary Examiner—Charles E. Atkinson
Attorney, Agent, or Firm—Townsend and Townsend

[57] ABSTRACT

An address control device changes the internal address corresponding to the address at which an error occurred to a new address if an error is detected in a data word during a read from a main memory device. The address control device specifies a different memory area during subsequent data writes and does not use the memory area in which the previous error occurred. Moreover, if the error detection device detects an error while a data word is read from the main memory device, a correction device corrects the data word.

3 Claims, 8 Drawing Sheets

FIG. 1

FIG.2(a) COMPOUND ADDRESS
FIG.2(b) WORD BIT CONFIGURATION

INFORMATION PROCESSING UNIT

BACKGROUND OF THE INVENTION

This invention relates to an information processing unit which reduces the frequency of errors in an information processing unit which has an error detection function.

Figure 6:
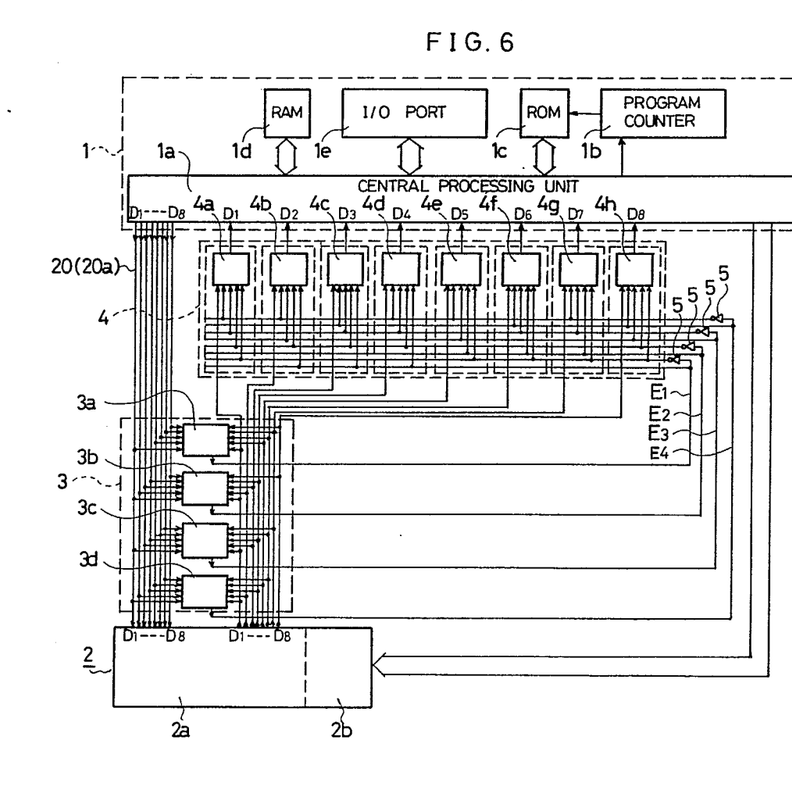
FIG. 6 is a block diagram of a conventional information processing unit.

FIG. 6 shows, in a block diagram, a conventional information processing unit of this type, which includes an information processing device 1. The information processing device 1 is configured as a microcomputer which includes a central processing unit 1a, a program counter 1b, a ROM 1c, a RAM 1d, and an I/O port 1e. A portion of the memory area of an $E^2$ PROM 2 is dedicated as a main memory device 2a which temporarily stores data words during the period between the stopping and the restarting of the operation of information processing device 1.

An error detection device 3 comprising four error detection circuits 3a, 3b, 3c, and 3d checks for errors during the reading of data words from main memory device 2a and generates an error signal if an error is detected. Specifically, as a data word is read, a combination of signal bits determined by the eight data lines comprising an I/O bus 20 (20a) are inputted to the error detection circuits 3a, 3b, 3c, and 3d. Error detection codes generated, based on the combination of these signal bits, are stored in the memory of the $E^2$ PROM 2 (the signal line for this memory is not shown in FIG. 6). Thus, when a data word is read from the main memory unit 2a, the signal bits of the data word, combined as described above, are entered from the I/O bus 20 (20b). These error checking codes are used to determine whether or not there are errors in the word (a more detailed explanation is provided below). Moreover, if any of the error detection circuits 3a, 3b, 3c, or 3d detects an error, it outputs a "0" level error signal $E_1$–$E_4$ respectively. FIG. 6, for the sake of simplicity, shows a separate input side 20a and an output side 20b for I/O bus 20. Time division multiplexing is actually used on the single bus 20.

If the error detection device 3 outputs an error signal, a correction device 4 corrects the data word read from the main memory unit 2a and passes it on to information processing device 1. The correction device 4 has 8 error correction circuits 4a, 4b, ..., and 4h which correspond to each bit of the data word. Each of the error correction circuits 4a, 4b, ..., 4h shown in FIG. 8 is a logic circuit comprised of a four input NAND gate 4x and a four input EX-NOR gate 4y. If an error occurs in a signal bit of a data word, each of the error correction circuits 4a–4h, controlled by the combination of output signals $E_1$–$E_4$ from the four error detection circuits 3a–3d or of the inversion of these output signals by inverter 5, inverts the signal bit corresponding to the error.

Figure 7:
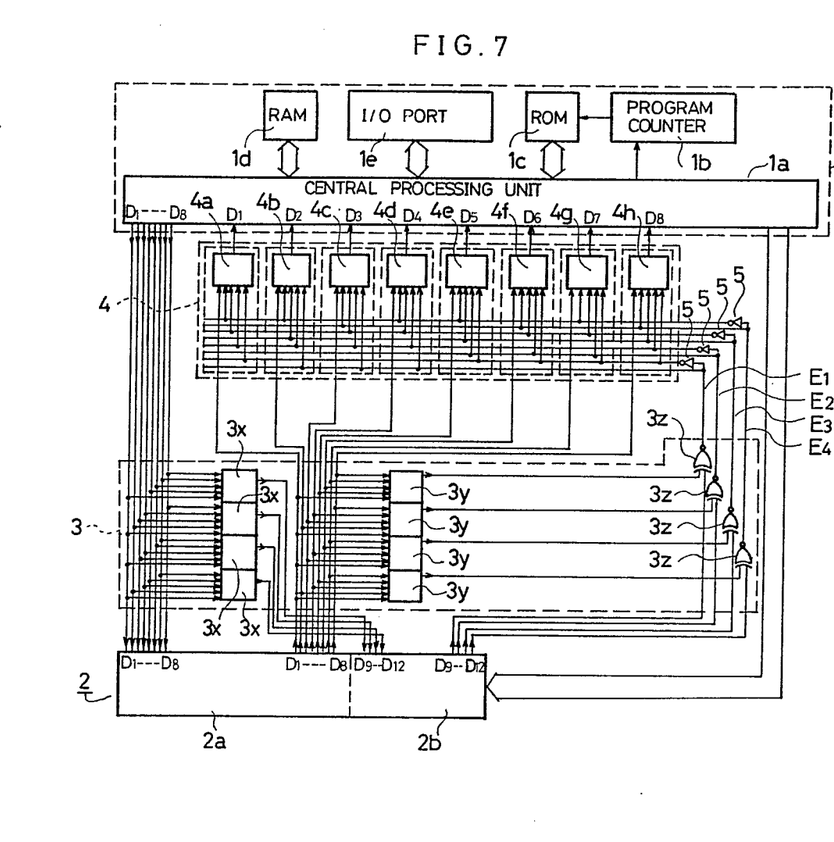
FIG. 7 is a block diagram showing a more detailed configuration of the conventional information processing unit.

FIG. 7 is a block diagram showing in greater detail the error detection device 3 of the information processing unit of FIG. 6. The input bus 20a combines five signal bits and enters them in the four error detection circuits 3a–3d respectively. An input side parity check circuit 3x performs a parity check on the five signal bits while an output side parity check circuit 3y performs a parity check on the same combination of five signal bits from the output bus 20b. An EX-NOR gate checks if the corresponding parity values obtained by parity check circuits 3x and 3y for the input side and the output side match.

A parity check memory unit 2b is allocated a memory area of the $E^2$ PROM 2, at the same address as in the main memory device 2a, for reading and writing the parity values of the four bit units requested by the input side parity check circuit 3x. The parity check circuits 3x and 3y are composed, as shown in FIG. 9, of the four EX-NOR gates 3n. If the sum of the five one digit binary inputs Da–De entered in these parity check circuits is even, then a "0" is outputted; if the sum is odd, then a "1" is output.

Processing in conventional information processing units configured as described above is carried out in the following manner if an error occurs in a data word stored in the main memory device 2a.

The error detection circuits 3a–3d of the error detection device 3 are connected to the I/O bus 20 as shown in TABLE 1 (in TABLE 1, O means a connection and X means no connection). For example, while a data word is being written to the main memory device 2a, the five inputs Da–De of the parity checking circuit 3x on the input side of the error detection circuit 3a become the signal bits D1, D5, D6, D7 and D8. A parity value of "0" is output if the sum of the signal bits is even and a "1" if the sum of the signal bits is odd. The parity value is temporarily stored in the parity value memory unit 2b of the $E^2$ PROM 2.

TABLE 1

|    |       | $D_1$ | $D_2$ | $D_3$ | $D_4$ | $D_5$ | $D_6$ | $D_7$ | $D_8$ |
|----|-------|-------|-------|-------|-------|-------|-------|-------|-------|
| 3a | $E_1$ | O     | X     | X     | X     | O     | O     | O     | O     |
| 3b | $E_2$ | O     | O     | O     | O     | X     | X     | X     | O     |
| 3c | $E_3$ | O     | X     | O     | O     | X     | O     | O     | X     |
| 3d | $E_4$ | O     | O     | X     | O     | O     | X     | O     | X     |

Similarly, the five inputs Da–De to the other error detection circuits 3b–3d become ($D_1$, $D_2$, $D_3$, $D_4$, $D_8$), ($D_1$, $D_3$, $D_4$, $D_6$, $D_7$), ($D_1$, $D_2$, $D_4$, $D_5$, $D_7$). The parity values of these combinations of signal bits are stored temporarily in the corresponding areas $D_9$–$D_{12}$ of the parity value memory unit 2b.

Next, while the central processor 12 reads a data word from a specified address in the main memory device 2a, the output side parity check circuit 3y of each of the error detection circuits 3a–3d requests the parity values for each of these same combinations of the five signal bits on the input side. The EX-NOR gate 3y checks if these parity values match the corresponding parity values stored in the parity value memory unit 2b.

If the parity values during read match the parity values during write, the error signals $E_1$–$E_4$ which each of the EX-NOR gates 3z outputs become "1"s. If the parity values do not match, signals $E_1$–$E_4$ become "0"s. The relationship between the correction of error signals $E_1$–$E_4$ and each of the signal bits $D_1$–$D_8$ can be shown by transposing the O mark with "0" and the X mark with "1" in TABLE 1 above. Accordingly, if $E_1$–$E_4$ are all "0"s (error detection circuits 3a–3d have all detected errors), this shows that an error has occurred in signal bit $D_1$. Taking another example, if $E_2$ and $E_4$ are both "0" and $E_1$ and $E_3$ are both "1", this shows that an error has occurred in signal bit $D_2$.

Each bit of a data word is entered into a corresponding error correction circuit 4a–4g in the correction device 4. Four inputs resulting from the combination of error signals $E_1$–$E_4$ from the error detection circuits 3a–3d or the combination of inverted error signals $E_1$–$E_4$, inverted by the inverter 5, are entered into a NAND gate 4x shown in FIG. 8. These four inputs control the corrections made on the signal bits entered in an EX-NOR gate 4y. For example, when signal bit $D_1$ of a data word is entered in the correction circuit 4a, which serves an input on one side of the EX-NOR gate 4y, we can determine from TABLE 1 that the inverted signals $\overline{E_1}$–$\overline{E_4}$ from error signals $E_1$–$E_4$ are connected as the four inputs to the NAND gate 4x. If $E_1$–$E_4$ are all "0"s, that is if an error has occurred in signal bit $D_1$, the four inputs to the NAND gate 4x all become "1"s and its output becomes a "0". The EX-NOR gate 4y inverts bit signal $D_1$ and then outputs the corrected signal bit. Similarly, the four inputs to the NAND gate 4x which serve as the correction circuit 4b for correcting signal bit $D_2$ are, according to TABLE 1, $E_1$, $\overline{E_2}$, and $\overline{E_4}$. If all four of these inputs are "1"s, that is when an error occurs in signal bit $D_2$, EX-NOR gate 4y inverts signal bit $D_2$ and outputs the corrected signal bit. The correction device 4 makes no corrections if there are no errors in the signal bits. The read data words are sent on to the information processing device 1 just as they were received.

However, while the information processing unit is completely stopped, data words which will be needed to restart processing are saved in the main memory unit 2a. These data words are read and used when the information processing unit is restarted. In this case, the data words stored in the main memory device 2a are read when the device restarts processing. The read data word is checked to determine if an error has occurred. There is a very high probability of errors occuring each time in a memory area containing an address while rewriting that address while a data word is written to the main memory device 2a during subsequent halts of the information processing unit.

Especially in a device such as $E^2$ PROM, in which the presence or absence of a stored charge on an insulator produces a "1" or a "0" in a non-volatile memory serving as the main memory device 2a, if the power supply is cut while memory is stored in the device and the memory is not periodically refreshed as DRAMs are, then as more time since the data was written to memory memory errors become more frequent. In bad memory areas, after memory has been held for a long time, there is a high probability of having two or more bit errors in a single data word. The function for correcting a 1 bit error in a data word cannot correct these errors.

SUMMARY OF THE INVENTION

According to one aspect of this invention there is provided an information processing unit capable of reducing the frequency of errors which occur during repeated reads and writes, which comprises a main memory device which allocates several memory areas and stores data words at each address; an information processing device which reads a data word corresponding to a given address read from the main memory device; an error checking device which outputs an error signal when a data word containing an error is read from the main memory device; an address control device which forbids the use of all memory areas corresponding to the address at which the error occurred which have been used up to that time and subsequently uses only new memory areas and which changes the internal address at the specified memory device in order to select one of the several memory areas described above.

According to another aspect of this invention there is provided an information processing unit which, using an correction device which corrects data words based on error signals, can operate normally even if errors occur in the data stored in memory by correcting the errors in the data.

The above features and advantages of the invention will become more apparent from the following description when taken in conjunction with the accompanying drawings.

BRIEF DESCRIPTION OF THE DRAWINGS

FIG. 2, comprised of FIGS. 2A and 2B, shows the configuration of a memory area of a memory device for the information processing unit;

FIG. 8 is a diagram of the logic of the correction circuit of the conventional information processing unit; and FIG. 9 is a diagram of the logic of the parity checking circuit of the conventional information processing unit.

DESCRIPTION OF THE PREFERRED EMBODIMENT

Figure 1:
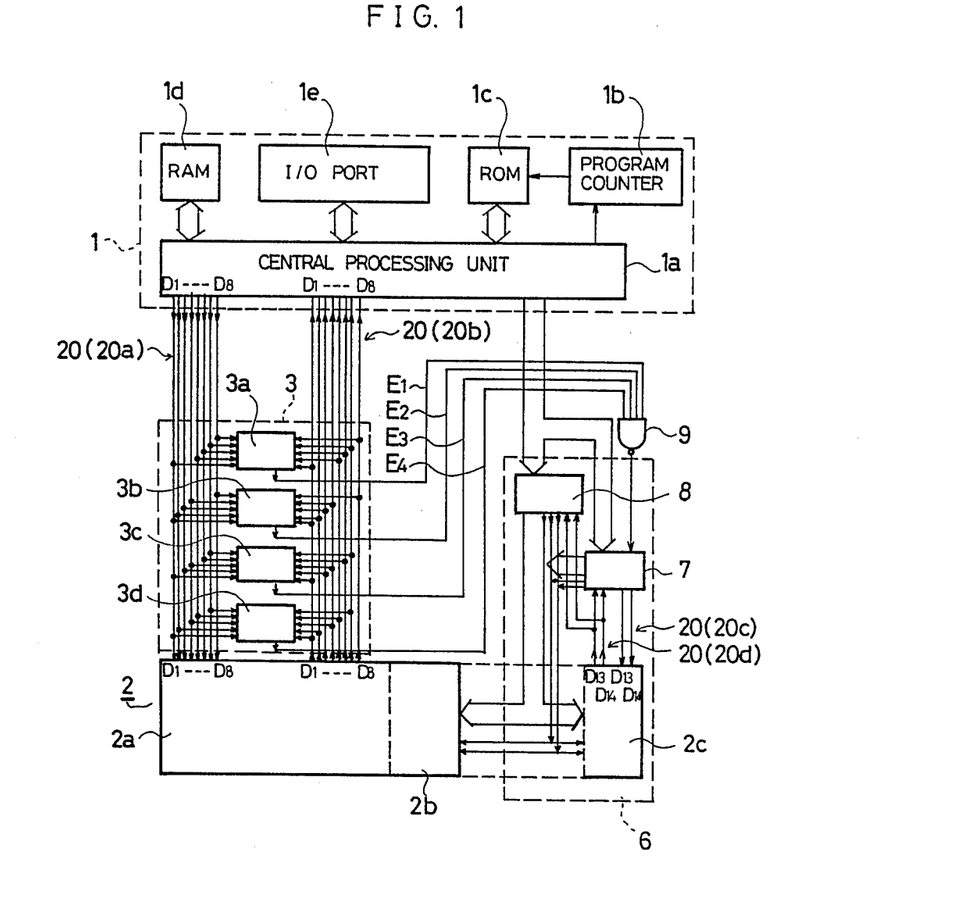
FIG. 1 is a block diagram of an information processing unit according to an embodiment of the invention.

FIG. 1 shows, in a block diagram, an information processing unit according to an embodiment of the invention. Devices 1, 1a–1e, 3, 3a–3d of the information processing unit are identical to their counterparts in conventional information processing units. The information processing device of this embodiment, like its conventional counterpart, uses portions of the memory area of $E^2$ PROM 2 for temporary storage of data words, for the main memory device 2a and for the parity value memory unit 2b. Unlike its conventional counterpart, however, each standard address (corresponding to the address of a conventional unit) specified by the central processor 1a of the information processing device of this embodiment is allocated one of four memory areas $2a_1$–$2a_4$ in the main memory device 2a. These four memory areas $_2a_1$–$2a_4$ are allocated using the two digit internal addresses (0,0), (0,1), (1,0) and (1,1). A compound address made by adding the internal address onto the standard address has a one-to-one correspondence with these memory areas.

An address control device 6 stores an internal address in order to select a unique memory area from among memory areas $_2a_1$–$2a_4$ for each standard address while changing the internal address of a standard address in which an error has occurred to another internal address on the basis of error signals $E_1$ to $E_4$ from the error checking device 3. The address control device 6 includes an internal address memory device 2c which stores internal addresses; an internal address update device 7 which updates internal address by rewriting them in the sequence shown in the flowchart of FIG. 3; and a compound address determination device 8 which specifies the compound address according to the procedure shown in the flowchart of FIG. 4 using the internal address stored in the internal address memory device 7 and the standard address specified by the central processor 1a and writes and reads data words to the memory areas of the main memory device 2a.

Figure 2A:
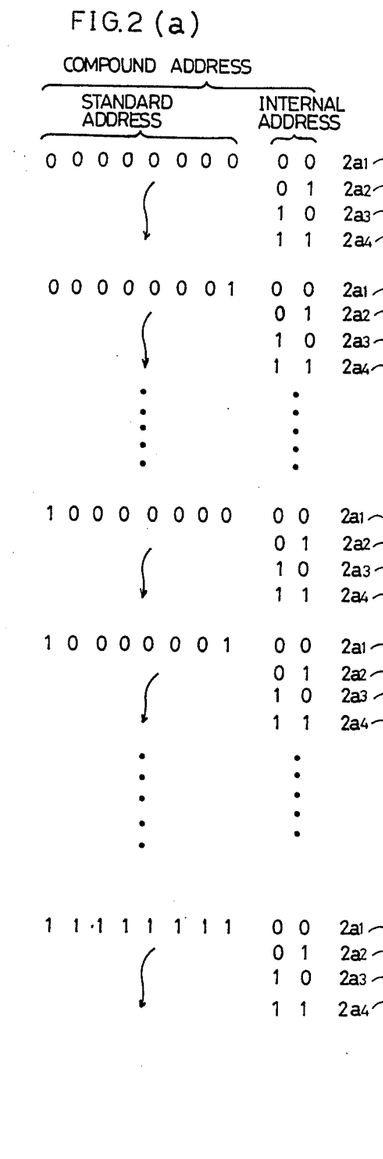
Figure 2B:
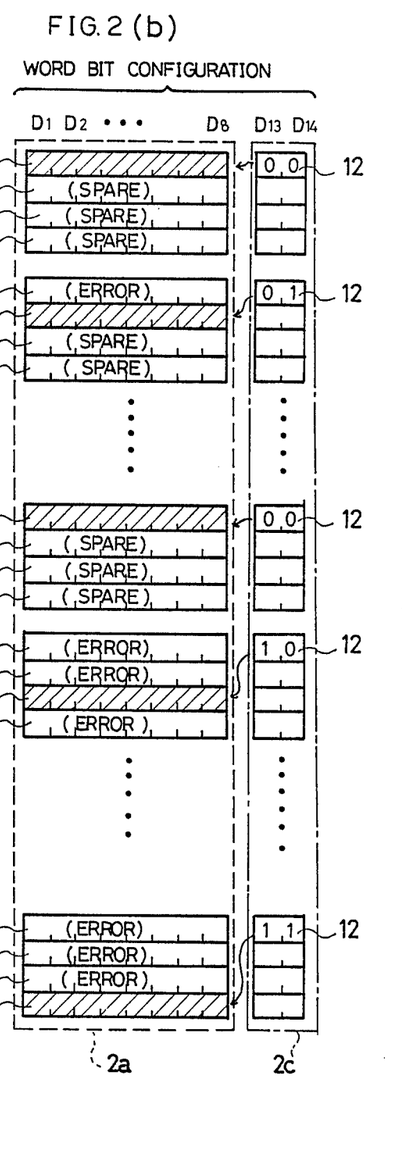

A portion of the memory area of $E^2$ PROM is allocated to the internal memory device 2c in this embodiment. An internal address memory area 12 is allocated for the memory area groups which correspond to each of the standard addresses as shown in FIG. 2.

The address of the internal address memory area 12 itself is the standard address plus the internal address (0,0). Thus, among the members of the memory area group $2a_1$-$2a_4$ which correspond to the standard address in FIG. 2(b), the memory area of the internal address (0,0) (see FIG. 2(a)) allocated to the uppermost memory area $2a_1$ can be taken as the internal address memory area. Therefore the embodiment of this information processing unit, unlike conventional information processing units, does not include the correction device 4.

Figure 3:
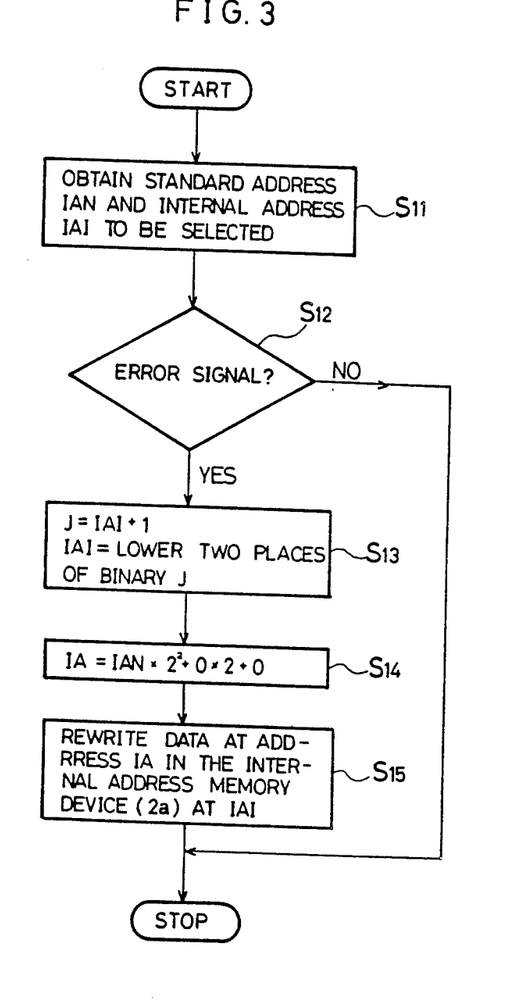
FIG. 3 is a flowchart showing the operating sequence of the internal address determination device for the information processing unit.
Figure 4:
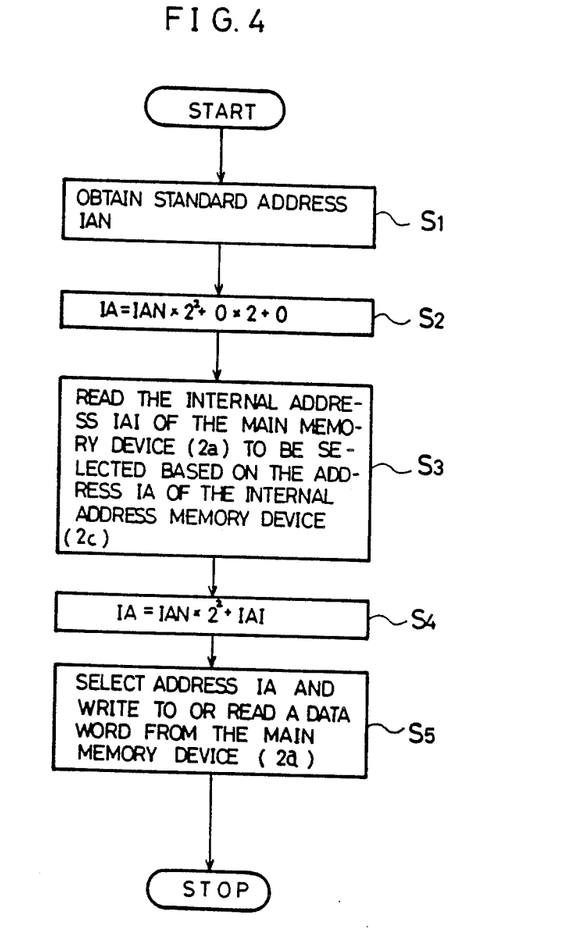
FIG. 4 is a flowchart of the operating sequence of a compound address selection device.

FIG. 1 shows hardware devices such as the internal address update device 7 and compound address determination device 8 which are distinct from the microcomputer which comprises the information processing device 1. FIG. 3 and FIG. 4 show specifically, using flowcharts, the functions implemented by information processing device 1 in software. In FIG. 1, for the sake of simplicity of explanation, the information processing device 1 and the main memory device 2a are connected by 8-bit data lines 20a and 20b, one running in each direction; and the internal address update device 7, the address determination device 8, and the internal address memory device 2c are connected by the 2 bit wires 20c and 20d. In actuality, these devices are linked by a single data bus 20 using time division multiplexing. I/O control circuits connected to $E^2$ PROM, to parity checking circuits and to other circuits which comprise error checking circuits 3a-3d produce various kinds of I/O control signals.

Next, the operation of this embodiment is explained with reference to FIG. 3 and FIG. 4.

The internal addresses stored in the internal address memory device 2c which correspond to each standard address are all initialized at (0,0). Thus, among the four compound addresses which correspond to each standard address, the memory area $2a_1$ of the main memory device 2a, which is equivalent to a compound address having an internal address specified by the two bits $D_13$ and $D_14$ (0,0), is used and the other three memory areas $2a_2$-$2a_4$ serve as spares.

In this initial condition, once the standard address from the central processor 1a has been specified, the compound address determination device 8 determines the compound address according to the flowchart of FIG. 4 so that the data word can be written to the main memory device 2a. Thus, first the standard address IAN is read in step $S_1$. Next, during step $S_2$, the two lower bits (0,0) are added to the standard address IAN to specify the virtual compound address IA.

During the next step $S_3$, the internal address IAI corresponding to the standard address IAN above is read from the internal address memory device 2c. During step $S_4$, the internal address IAI is added to the standard address IAN above to determine the true compound address IA.

In the initial state above, the true compound address IA is identical to the previous virtual compound address since the internal addresses stored in the internal address memory device 2c are all (0,0). This means that of all the group of memory areas $2a_1$-$2a_4$ which correspond to each standard address, the memory area $2a_1$, which is in the top position, is specified. However, after the update described below has been carried out, this compound address IA has a different value from the virtual compound address. Therefore, at that time an address value other than the memory area of memory area $2a_1$ is specified for the compound address IA.

Once the compound address IA has been determined in this manner, during the next step $S_5$, using the requested compound memory address IA, a data word is written to the corresponding memory area in the main memory device 2a.

Next, the data words written to each memory area of the main memory device 2a are read. This processing is also performed if the central processor 1 specifies the standard addresses. This means that if the compound address determination device 8 specifies the compound address IA in the same manner as the operating sequence described above, then a data word is read from the corresponding memory area in the main memory device 2a. While this data word is being read, the error detection device 3 detects an error in the data word in the same manner as in a conventional device. In the embodiment of this first invention, however, the error signals $E_1$-$E_4$ provided by the error detection circuits 3a-3d go to the four input NAND gate 9 and are then input to the internal address update device 7.

If one of the error signals $E_1$-$E_4$ is "0", then an error has been detected and the output of the NAND gate 9 becomes a "1". Depending upon the output of the NAND gate 9, the internal address update device 7 performs the internal address update procedure according to the flowchart shown in FIG. 3.

This means that first, the compound address currently specified in step $S_11$ can be used. Specifically, the standard address IAN of the central processor 1a or the internal address IAI of the internal address memory device 1c can be used.

Next, during step $S_12$, the output of the NAND gate 9 is checked to determine if it is a "0" or a "1". If the output of the NAND gate 9 is a "1", then an error has been detected in the data word, and steps $S_13$-$S_15$ are executed. During step $S_13$, a 1 is added to IAI, the binary internal address, and an operation is performed to add the new internal address IAI to the lower two digits of the sum J. During step $S_14$, the bit configuration address which is the 2 bits (0,0) appended to the currently specified standard address IAN, is requested as the address of the memory area of the internal address memory device 1c which stores the internal address of the standard address IAN above. During step $S_15$, the old internal address AI in the internal address memory area specified during step $S_14$ is rewritten at the new internal address IAI requested during the step $S_13$.

Thus, the internal address stored in the internal address memory device 1c is updated from (0,0) to (0,1).

The example shown in FIG. 2 shows that the internal address corresponding to the standard address (0,0,0,0,0,0,0,1) is updated to (0,1) as described above. During subsequent reads and writes the main memory device 2a uses the memory area $2a_2$ and does not use the memory area $2a_1$ where an error occurred.

Moreover, FIG. 2 shows a case in which the internal address corresponding to the standard address (1,0,0,0,0,0,1) is updated from the (0,1) described above by 1 (1,0) and another case in which the internal address corresponding to the standard address (1,1,1,1,1,1,1,1) is once again updated by 1 from (1,0) to (1,1).

If an error is not detected during step $S_12$ as shown in FIG. 3, then the internal address is not updated during steps $S_13$–$S_15$ and the old internal address continues to be held in memory. Accordingly, if an error has not occurred since initialization, as shown in the example of FIG. 2 where the internal address (0,0) corresponding to the standard address (0,0,0,0,0,0,0,0) remains in the same state and the memory area is not changed.

In the operations discussed above, if an error occurs in a data word, then the memory area in the main memory device 2a where that data word was stored is not used subsequently. The frequency of errors generated by repeated reads and writes is reduced by switching sequentially among the memory areas which had been theretofore reserved as spares.

Figure 5:
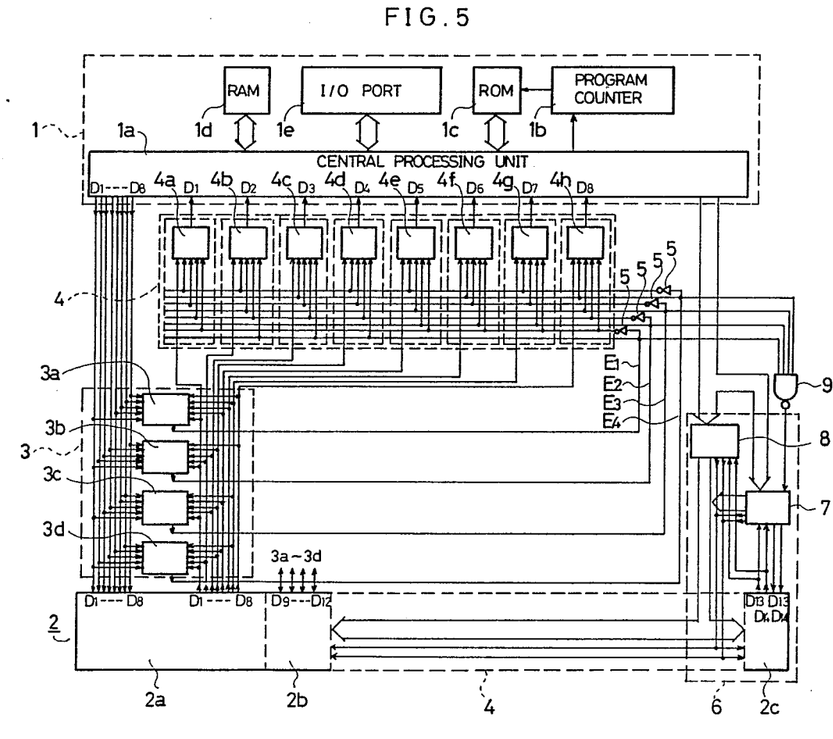
FIG. 5 is a block diagram of an information processing unit according to another embodiment of the invention.

FIG. 5 shows, in a block diagram, another embodiment of the invention. In this diagram the correction device 4 is attached to the embodiment just as it is to a conventional unit. Moreover, the correction device 4 operates in this embodiment just as it does in a conventional unit. The effectiveness of the correction device 4 in this information processing unit is improved because the correction device not only corrects an error bit when a one bit error occurs during the reading of a data word, as does a conventional device, but has the additional function, performed by the address control device 6, of sequentially eliminating memory areas in which an error has occurred.

This means that the main memory device 2 of the embodiment shown in FIG. 1, if a non-volatile memory such as that of $E^2$ PROM in which the error probability increases as a long period has passed since data was written to the memory is used, the probability of two or more errors occuring in a memory area in which a one bit error has already occurred in a single data word after the data word has been held in memory for a long time increases. The address control device 6, by sequentially avoiding the use of memory areas in which an error has occurred, can greatly reduce the probability of a two bit error occurring in a single data word. This reduces the chance that the correction device 3 will not be able to correct the bit error.

Although in the embodiment described above the main memory device 2a, the parity value memory unit 2b, and the internal address memory unit 2c are all configured in a single $E^2$ PROM, separate memories can also be used for each of these devices. Moreover, although the embodiment described above is the implementation of the information processing device 1 on a microcomputer, it can be implemented as well on larger computers such as medium sized computers and mainframe computers. Other ICs such as DRAMs can be used for the main memory device 2a instead of the $E^2$ PROM used in this embodiment.

According to one aspect of the invention, as explained above, the address control device gradually reduces the number of errors during repeated read write processing by forbidding the subsequent use of memory areas of the main memory device in which an error has occurred and uses new memory areas.

Moreover, according to another aspect of the invention, the addition of a correction device which corrects errors to the address control device results in the reading of corrected data words if an error has occurred. The functions of these two units can be combined effectively.

What is claimed is:

1. An information processing unit comprising:
a memory device which stores a data word at a standard memory address;
with each standard memory address specifying several memory areas in which to store said data word and wherein each of said several memory areas is identified by an internal address;
a central processing unit which accesses said data word stored in said memory device by sending said standard memory address to an address control device;
said address control device, coupled to said central processing unit, stores said internal address and combines said internal address with said standard address to form a compound address specifying a given one of said several memory areas in which said data word is stored;
an error detection device, coupled to said memory device and said address control device, which generates an error signal if the data word read from said memory device contains an error;
said address control device having an internal address update device which, upon receipt of said error signal, prevents the use of the given memory area used to store said error containing data word by selecting a new internal address, and wherein said address control device forms a new compound address.

2. An information processing unit comprising:
a memory device which stores a data word at a standard memory address;
with each standard memory address specifying several memory areas in which to store said data word and wherein each of said several memory areas is identified by an internal address;
a central processing unit which accesses said data word stored in said memory device by sending a standard memory address to an address control device;
said address control device, coupled to said central processing unit, stores said internal address and combines said internal address with said standard address to form a compound address specifying a given one of said several memory areas in which said data word is stored;
an error detection device, coupled to said memory device and said address control device, which generates an error signal if the data word read from said memory device contains an error;
said address control device having an internal address update device which, upon receipt of said error signal, prevents the use of the given memory area used to store said error containing data word by selecting a new internal address, and wherein said address control device forms a new compound address; and
an error correction device, coupled to said error detection device, which, corrects errors in a data word read from said memory device, according to said error signals.

3. An address control device in an information processor, having a central processing unit, an error detection device and a memory for storing data words comprising:
- an internal address device which stores an internal address designating which one of a set of memory areas associated with a standard memory address contains a given data word;
- an internal address update device which writes a new internal address to said internal address device when said internal address update device receives an error signal from said error detection device indicating that said given data word read from said memory contains an error; and
- a compound address device which combines said internal address stored in said internal address memory device with a standard address received from the central processing unit of said information processor to form a compound address which designates a given memory area containing said given data word.

* * * * *